(12) United States Patent
Yin et al.

(10) Patent No.: US 10,742,240 B2
(45) Date of Patent: Aug. 11, 2020

(54) SIGNAL PROCESSING METHOD AND DEVICE

(71) Applicant: HUAWEI TECHNOLOGIES CO., LTD., Shenzhen (CN)

(72) Inventors: Qian Yin, Shanghai (CN); Yuxiang Xiao, Shanghai (CN); Erni Zhu, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/521,598

(22) Filed: Jul. 25, 2019

(65) Prior Publication Data

US 2019/0349014 A1   Nov. 14, 2019

Related U.S. Application Data

(63) Continuation of application No. PCT/CN2017/072651, filed on Jan. 25, 2017.

(51) Int. Cl.
*H04B 1/00* (2006.01)
*H04B 1/04* (2006.01)

(52) U.S. Cl.
CPC .......... *H04B 1/0028* (2013.01); *H04B 1/005* (2013.01); *H04B 1/04* (2013.01)

(58) Field of Classification Search
CPC ........ H04B 1/0028; H04B 1/04; H04B 1/005; H04B 2001/0408; H03F 3/24; H03F 1/02
See application file for complete search history.

(56) References Cited

U.S. PATENT DOCUMENTS

| | | | | |
|---|---|---|---|---|
| 7,929,923 B2 * | 4/2011 | Elmala | ................. | H03F 1/0294 330/124 R |
| 8,005,445 B2 * | 8/2011 | Kuriyama | ............ | H03F 1/0205 330/124 R |
| 8,026,764 B2 * | 9/2011 | Sorrells | ..................... | H03F 1/32 330/124 R |
| 9,106,500 B2 * | 8/2015 | Sorrells | ................. | H03F 1/0205 |
| 9,912,303 B2 * | 3/2018 | Barton | .................. | H03F 1/0294 |
| 2006/0209984 A1 | 9/2006 | Kenington | | |

(Continued)

FOREIGN PATENT DOCUMENTS

| | | |
|---|---|---|
| CN | 1790920 A | 6/2006 |
| CN | 101347020 A | 1/2009 |

(Continued)

*Primary Examiner* — Kenneth T Lam
(74) *Attorney, Agent, or Firm* — Kilpatrick Townsend & Stockton LLP

(57) ABSTRACT

A signal processing method and device are used to obtain multi-band signals that enable a dual-input power amplifier to achieve high working performance during amplification. The device can decompose and combine analog radio frequency signals of at least two frequency bands by using an analog signal decomposition apparatus and a combination apparatus, to obtain two paths of multi-band signals whose spectra include the at least two frequency bands. The two paths of signals satisfy nonlinearity of the dual-input power amplifier. Therefore, after the two paths of signals are input into the dual-input power amplifier, the dual-input power amplifier can achieve optimal working performance.

14 Claims, 10 Drawing Sheets

(56) References Cited

U.S. PATENT DOCUMENTS

| | | | |
|---|---|---|---|
| 2009/0274039 A1* | 11/2009 | Yamagishi | H04L 27/2647 370/210 |
| 2009/0296835 A1 | 12/2009 | Hidaka | |
| 2015/0103952 A1 | 4/2015 | Wang et al. | |
| 2017/0149460 A1 | 5/2017 | Li et al. | |
| 2017/0302233 A1 | 10/2017 | Huang | |
| 2018/0123617 A1* | 5/2018 | Huang | H04B 1/0475 |

FOREIGN PATENT DOCUMENTS

| | | |
|---|---|---|
| CN | 102098247 A | 6/2011 |
| CN | 102281222 A | 12/2011 |
| CN | 102594749 A | 7/2012 |
| CN | 104980174 A | 10/2015 |
| CN | 105900333 A | 8/2016 |
| EP | 2822242 A1 | 1/2015 |
| JP | 2007274310 A | 10/2007 |
| WO | 2016065633 A1 | 5/2016 |

* cited by examiner

SIGNAL PROCESSING METHOD AND DEVICE

CROSS-REFERENCE TO RELATED APPLICATIONS

This application is a continuation of International Application No. PCT/CN2017/072651, filed on Jan. 25, 2017, which is hereby incorporated by reference in its entirety.

TECHNICAL FIELD

This application relates to the field of communications technologies, and in particular, to a signal processing method and device.

BACKGROUND

A power amplifier (PA) is usually at an end of a transmission link of a base station in a wireless communication system, and is an important component of a base station.

With development of communications technologies, a base station needs to support services of a plurality of frequency bands simultaneously. Therefore, the base station needs to implement a function of simultaneously transmitting signals of a plurality of frequency bands (for example, 1.8 gigahertz (GHz)+2.1 GHz, or 1.8 GHz+2.1 GHz+2.6 GHz) by using a multi-band power amplifier.

Types of current power amplifiers include a single-input structure and a dual-input structure. For a power amplifier of a single-input structure (also referred to as a single-input power amplifier), a compromise among output power, working efficiency, and a signal bandwidth needs to be made, and therefore the output power and the working efficiency are not high. Compared with the single-input power amplifier, a power amplifier of a dual-input structure (also referred to as a dual-input power amplifier) can increase output power and working efficiency.

Because a power amplifier that amplifies multi-band signals needs to ensure a relatively high broadband requirement, if a single-input power amplifier is used to process the multi-band signals, higher output power and working efficiency need to be sacrificed while the broadband requirement is satisfied. Therefore, a dual-input power amplifier is an ideal choice. How to process a radio frequency signal to obtain a multi-band signal or a broadband signal that can optimize output power and working efficiency of the dual-input power amplifier is a problem that urgently needs to be resolved by a person skilled in the field of wireless communications.

SUMMARY

Embodiments of this application provide a signal processing method and device, to obtain multi-band signals that enable a dual-input power amplifier to achieve high working performance during amplification.

According to a first aspect, an embodiment of this application provides a signal processing device. The device includes an analog signal decomposition apparatus and a combination apparatus. In a process in which the signal processing device performs signal processing, the analog signal decomposition apparatus receives analog radio frequency signals of at least two frequency bands, and performs non-linear change processing on the analog radio frequency signal of each of the at least two frequency bands, to obtain a first signal and a second signal; and the combination apparatus combines first signals generated in the analog signal decomposition apparatus and combines generated second signals, to obtain two paths of signals whose spectra include the at least two frequency bands.

The first signal and the second signal have nonlinearity, and the two paths of signals obtained after combination by the combination apparatus also have the nonlinearity. Therefore, after the two paths of signals are input into a dual-input power amplifier, the dual-input power amplifier can achieve optimal working performance. Therefore, by using the signal processing device, multi-band signals that enable the dual-input power amplifier to achieve high working performance during amplification can be obtained.

In a possible design, the analog signal decomposition apparatus is configured to receive analog radio frequency signals of at least two frequency bands, to generate a first signal and a second signal, where the first signal and the second signal are obtained through a non-linear change based on an analog radio frequency signal of a first frequency band, and the first frequency band is any one of the at least two frequency bands; and the combination apparatus is configured to: combine the first signal obtained based on the analog radio frequency signal of the first frequency band and a first signal obtained based on an analog radio frequency signal of another frequency band, and combine the second signal obtained based on the analog radio frequency signal of the first frequency band and a second signal obtained based on the analog radio frequency signal of the another frequency band, to generate two paths of signals, where the another frequency band is a frequency band other than the first frequency band in the at least two frequency bands, and spectra of the two paths of signals include the at least two frequency bands.

In a possible design, the analog signal decomposition apparatus obtains, through envelope detection and controllable non-linear processing, the first signal and the second signal that are generated based on the analog radio frequency signal of the first frequency band.

In this way, it can be ensured that the first signal and the second signal generated by the analog signal decomposition apparatus have nonlinearity.

In a possible design, the analog signal decomposition apparatus includes a combiner, an envelope detector, a controllable non-linear processor, and a multiplier; in a process in which the analog signal decomposition apparatus performs non-linear processing on the analog radio frequency signal of the first frequency band, the combiner receives the analog radio frequency signals of the at least two frequency bands, and combines the analog radio frequency signals of the at least two frequency bands, to generate a combined signal; the envelope detector performs envelope detection on the combined signal, to generate a combined detection signal; the controllable non-linear processor performs non-linear processing on the combined detection signal based on a non-linear parameter, to generate two paths of non-linear signals; and the multiplier multiplies each of the two paths of non-linear signals by the analog radio frequency signal of the first frequency band to obtain the first signal and the second signal.

In this way, the signal processing device can obtain the first signal and the second signal that have non-linear features required by the dual-input power amplifier by using the analog signal decomposition apparatus, to ensure that the two paths of signals obtained through subsequent combination also have the non-linear features, so that after the two paths of signals are input into the dual-input power amplifier, the dual-input power amplifier can achieve optimal working performance.

In a possible design, the analog signal decomposition apparatus includes an envelope detector, a combiner, a controllable non-linear processor, and a multiplier; in a process in which the analog signal decomposition apparatus performs non-linear processing on the analog radio frequency signal of the first frequency band, the envelope detector receives the analog radio frequency signals of the at least two frequency bands, and performs envelope detection on the analog radio frequency signals of the at least two frequency bands, to generate at least two paths of detection signals; the combiner combines the at least two paths of detection signals, to generate a combined detection signal; the controllable non-linear processor performs non-linear processing on the combined detection signal based on a non-linear parameter, to generate two paths of non-linear signals; and the multiplier multiplies each of the two paths of non-linear signals by the analog radio frequency signal of the first frequency band to obtain the first signal and the second signal.

In this way, the signal processing device can obtain the first signal and the second signal that have non-linear features required by the dual-input power amplifier by using the analog signal decomposition apparatus, to ensure that the two paths of signals obtained through subsequent combination also have the non-linear features, so that after the two paths of signals are input into the dual-input power amplifier, the dual-input power amplifier can achieve optimal working performance. Optionally, the controllable non-linear processor may perform non-linear processing on the combined detection signal based on different non-linear parameters, to generate two paths of non-linear signals, so as to further optimize working performance of the dual-input power amplifier.

In a possible design, a non-linear parameter of the controllable non-linear processor satisfies a non-linear working characteristic of the dual-input power amplifier. By setting the non-linear parameter of the controllable non-linear processor, it can be ensured that the two paths of non-linear signals generated by the controllable non-linear processor include, in each frequency band, the non-linear feature that satisfies a power amplifier characteristic requirement of the dual-input power amplifier. In this way, after the two paths of non-linear signals enter the dual-input power amplifier after various types of processing, accurate load pulling is formed, to ensure that the dual-input power amplifier can achieve optimal working efficiency and optimal linearity, or implement a compromise among optimal working efficiency and optimal linearity.

In a possible design, the signal processing device further includes a frequency conversion apparatus, and the frequency conversion apparatus may receive analog baseband signals of the at least two frequency bands, and perform frequency conversion on the analog baseband signals of the at least two frequency bands, to generate the analog radio frequency signals of the at least two frequency bands.

In this way, when an original signal received by the signal processing device is an analog baseband signal, the signal processing device can obtain an analog radio frequency signal by using the frequency conversion apparatus.

In a possible design, based on the foregoing design, the signal processing device further includes a digital-to-analog conversion apparatus, configured to: receive digital baseband signals of the at least two frequency bands, and convert the digital baseband signals of the at least two frequency bands into the analog baseband signals of the at least two frequency bands.

In this way, when an original signal received by the signal processing device is a digital baseband signal, the signal processing device may first convert digital baseband signals of the at least two frequency bands into the analog baseband signals of the at least two frequency bands by using the digital-to-analog conversion apparatus, so that the frequency conversion apparatus can process the analog baseband signals of the at least two frequency bands, to obtain analog radio frequency signals of the at least two frequency bands.

According to a second aspect, an embodiment of this application further provides a power amplification device, and the power amplification device includes the signal processing device according to any one of the foregoing designs and a dual-input power amplifier, where the dual-input power amplifier is connected to the combination apparatus and after the signal processing device obtains the two paths of signals, performs power amplification on the two paths of signals to generate a path of radio frequency signal, where a spectrum of the radio frequency signal includes the at least two frequency bands.

Because the two paths of signals obtained by using the signal processing device satisfy the non-linear feature of the power amplifier, by using the power amplification device provided in this embodiment of this application, the dual-input power amplifier in the power amplification device can achieve optimal working performance, and signals satisfying performance requirements of radio frequency signals of a plurality of frequency bands are obtained.

According to a third aspect, an embodiment of this application further provides an analog signal decomposition apparatus, including an envelope detector and a controllable non-linear processor, where the envelope detector is configured to perform envelope detection on analog radio frequency signals including at least two frequency bands; the controllable non-linear processor is configured to generate two paths of non-linear signals based on an output of the envelope detector and a non-linear parameter; and the analog signal decomposition apparatus generates a first signal and a second signal based on an analog radio frequency signal of a first frequency band and the two paths of non-linear signals.

In a possible design, the analog signal decomposition apparatus includes a combiner, an envelope detector, a controllable non-linear processor, and a multiplier; in a process in which the analog signal decomposition apparatus performs non-linear processing on the analog radio frequency signal of the first frequency band, the combiner receives the analog radio frequency signals of the at least two frequency bands, and combines the analog radio frequency signals of the at least two frequency bands, to generate a combined signal; the envelope detector performs envelope detection on the combined signal, to generate a combined detection signal; the controllable non-linear processor performs non-linear processing on the combined detection signal based on a non-linear parameter, to generate two paths of non-linear signals; and the multiplier multiplies each of the two paths of non-linear signals by the analog radio frequency signal of the first frequency band to obtain the first signal and the second signal.

In this way, the signal processing device can obtain the first signal and the second signal that have nonlinearity required by the dual-input power amplifier by using the analog signal decomposition apparatus, to ensure that the two paths of signals obtained through subsequent combination also have the nonlinearity, so that after the two paths of signals are input into the dual-input power amplifier, the dual-input power amplifier can achieve optimal working performance.

In another possible design, the analog signal decomposition apparatus includes an envelope detector, a combiner, a controllable non-linear processor, and a multiplier; in a process in which the analog signal decomposition apparatus performs non-linear processing on the analog radio frequency signal of the first frequency band, the envelope detector receives the analog radio frequency signals of the at least two frequency bands, and performs envelope detection on the analog radio frequency signals of the at least two frequency bands, to generate at least two paths of detection signals; the combiner combines the at least two paths of detection signals, to generate a combined detection signal; the controllable non-linear processor performs non-linear processing on the combined detection signal based on a non-linear parameter, to generate two paths of non-linear signals; and the multiplier multiplies each of the two paths of non-linear signals by the analog radio frequency signal of the first frequency band to obtain the first signal and the second signal.

In this way, the signal processing device can obtain the first signal and the second signal that have non-linear features required by the dual-input power amplifier by using the analog signal decomposition apparatus, to ensure that the two paths of signals obtained through subsequent combination also have the non-linear features, so that after the two paths of signals are input into the dual-input power amplifier, the dual-input power amplifier can achieve optimal working performance.

With reference to the foregoing possible design manners, optionally, the controllable non-linear processor may perform non-linear processing on the combined detection signal based on different non-linear parameters, to generate two paths of non-linear signals, so as to further optimize working performance of the dual-input power amplifier.

According to a fourth aspect, this application provides a chip system, configured to implement the device or apparatus in any one of the foregoing aspects or any one of the possible designs. The chip system may include chips, or may include chips and another discrete device. The chip may be an application-specific integrated circuit (ASIC), or may be a chip of another form. Optionally, the chip system may further include a processor, configured to support the foregoing device or apparatus in implementing functions involved in the foregoing aspects, for example, obtaining signals and/or parameters involved in the foregoing aspects, or performing signal processing processes in the foregoing aspects. In a possible design, the chip system further includes a memory, and the memory is configured to store program instructions and data necessary for a digital predistortion processing apparatus.

According to a fifth aspect, an embodiment of this application further provides a signal processing method, including: generating a first signal and a second signal based on analog radio frequency signals of at least two frequency bands, where the first signal and the second signal are obtained through a non-linear change based on an analog radio frequency signal of a first frequency band, and the first frequency band is any one of the at least two frequency bands; and combining the first signal obtained based on the analog radio frequency signal of the first frequency band and a first signal obtained based on an analog radio frequency signal of another frequency band, and combining the second signal obtained based on the analog radio frequency signal of the first frequency band and a second signal obtained based on the analog radio frequency signal of the another frequency band, to generate two paths of signals, where the another frequency band is a frequency band other than the first frequency band in the at least two frequency bands, and spectra of the two paths of signals include the at least two frequency bands.

In a possible design, the generating a first signal and a second signal based on analog radio frequency signals of at least two frequency bands includes: obtaining, through envelope detection and controllable non-linear processing, the first signal and the second signal that are generated based on the analog radio frequency signal of the first frequency band.

In a possible design, the generating a first signal and a second signal based on analog radio frequency signals of at least two frequency bands includes: combining the analog radio frequency signals of the at least two frequency bands, to generate a combined signal; performing envelope detection on the combined signal, to generate a combined detection signal; performing non-linear processing on the combined detection signal based on a non-linear parameter, to generate two paths of non-linear signals; and multiplying each of the two paths of non-linear signals by the analog radio frequency signal of the first frequency band to obtain the first signal and the second signal.

In a possible design, the generating a first signal and a second signal based on analog radio frequency signals of at least two frequency bands includes: performing envelope detection on the analog radio frequency signals of the at least two frequency bands, to generate at least two paths of detection signals; combining the at least two paths of detection signals, to generate a combined detection signal; performing non-linear processing on the combined detection signal based on a non-linear parameter, to generate two paths of non-linear signals; and multiplying each of the two paths of non-linear signals by the analog radio frequency signal of the first frequency band to obtain the first signal and the second signal.

In a possible design, before the generating a first signal and a second signal based on analog radio frequency signals of at least two frequency bands, the method further includes: performing frequency conversion on analog baseband signals of the at least two frequency bands, to generate the analog radio frequency signals of the at least two frequency bands.

In a possible design, before the performing frequency conversion on the analog baseband signals of the at least two frequency bands, the method further includes: converting digital baseband signals of the at least two frequency bands into the analog baseband signals of the at least two frequency bands.

In a possible design, the method further includes: performing power amplification on the two paths of signals to generate a path of radio frequency signal, where a spectrum of the radio frequency signal includes the at least two frequency bands.

Optionally, the method may be applied to the signal processing device in the foregoing aspects, or may be applied to another signal processing device that needs to perform decomposition and/or non-linear processing on multi-band signals or broadband signals, for example, a base station.

According to a sixth aspect, an embodiment of this application provides a signal processing device, and the signal processing device has a function of implementing any design in the fifth aspect. The function may be implemented by using hardware or by using hardware implementing corresponding software. The hardware or software includes one or more modules corresponding to the foregoing function.

According to a seventh aspect, an embodiment of this application provides a computer storage medium, used to store a computer software instruction used by the foregoing signal processing device, and including programs configured to execute the foregoing aspects.

In the embodiments of this application, the signal processing device includes the analog signal decomposition apparatus and the combination apparatus. The analog signal decomposition apparatus may make a non-linear change on an analog radio frequency signal of each of at least two frequency bands, to generate a first signal and a second signal obtained based on the analog radio frequency signal of each frequency band. The combination apparatus may combine first signals obtained based on the analog radio frequency signals of the at least two frequency bands, and combine second signals obtained based on the analog radio frequency signals of the at least two frequency bands, to finally generate two paths of signals whose spectra include the at least two frequency bands. Because the analog signal decomposition apparatus generates the first signal and the second signal by making the non-linear change on the analog radio frequency signal of each frequency band, the two paths of signals obtained by separately combining the generated first signals and second signals satisfy, in each frequency band, a non-linear feature of the dual-input power amplifier. Therefore, after the two paths of the signals are input into the dual-input power amplifier, the dual-input power amplifier can achieve optimal working performance. In addition, because the spectra of the generated two paths of signals include the at least two frequency bands, the two paths of signals are broadband signals (or multi-band signals). In summary, the signal processing device can obtain multi-band signals that enable the dual-input power amplifier to achieve high working performance.

DESCRIPTION OF EMBODIMENTS

Figure 1:
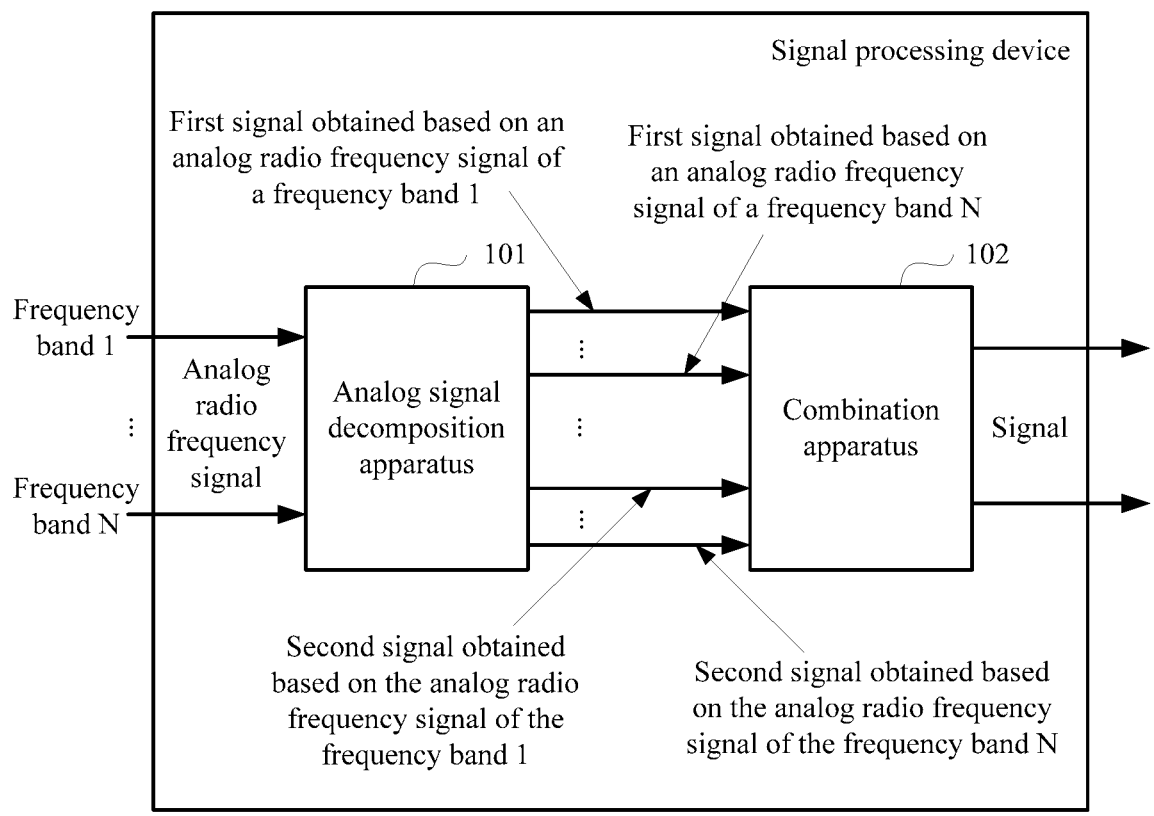
FIG. 1 is a structural diagram of a signal processing device according to an embodiment of this application.

This application is further described below with reference to the accompanying drawings.

Embodiments of this application provide a signal processing method and device, to obtain multi-band signals that enable a dual-input power amplifier to achieve relatively high working performance during amplification. The method and apparatus are based on a same inventive concept. Because principles based on which the method and apparatus resolve problems are similar, implementations of the apparatus and method may refer to each other, and repeated parts are not described again.

The signal processing device or power amplification device in the embodiments of this application may be any network device or user equipment that needs to process a signal or perform power amplification on a signal, or one or more software and/or hardware modules in the network device or user equipment. User equipment in this application may include various handheld devices, in-vehicle devices, wearable devices, computing devices, or control devices that provide a radio communication function; another processing device connected to a wireless modem; or user equipment (UE) in various forms, including a mobile station (MS), a terminal, terminal equipment, and the like. For ease of description, in this application, the devices mentioned above are collectively referred to as user equipment (UE). A network side device involved in this application includes a base station (BS), a network controller, a mobile switching center, or the like. An apparatus that directly communicates with user equipment via a wireless channel is usually a base station, and the base station may include various forms of macro base stations, micro base stations, relay stations, access points, or remote radio units (RRU), and the like. Certainly, other network side devices having a wireless communication function may also perform wireless communication with the user equipment, and this is not uniquely limited in this application. In systems that use different wireless access technologies, a name of a device having a base station function may differ. For example, in an LTE network, the device is referred to as an evolved NodeB (evolved NodeB, eNB, or eNodeB), and in a 3G (third generation) network, the device is referred to as a NodeB, and so on.

In the embodiments of this application, the signal processing device includes an analog signal decomposition apparatus and a combination apparatus. The analog signal decomposition apparatus may make a non-linear change on an analog radio frequency signal of each of at least two frequency bands, to generate a first signal and a second signal obtained based on the analog radio frequency signal of each frequency band. The combination apparatus may combine first signals obtained based on the analog radio frequency signals of the at least two frequency bands, and combine second signals obtained based on the analog radio frequency signals of the at least two frequency bands, to finally generate two paths of signals whose spectra include the at least two frequency bands.

Because the analog signal decomposition apparatus generates the first signal and the second signal by making the non-linear change on the analog radio frequency signal of each frequency band, the two paths of signals obtained by separately combining the generated first signals and second signals satisfy, in each frequency band, a non-linear feature of the dual-input power amplifier. Therefore, after the two paths of the signals are input into the dual-input power amplifier, the dual-input power amplifier can achieve optimal working performance. In addition, because the spectra of the generated two paths of signals include the at least two frequency bands, the two paths of signals are multi-band signals. In summary, the signal processing device can obtain multi-band signals that enable the dual-input power amplifier to achieve high working performance.

The technical solutions of the embodiments of this application are described below with reference to the accompanying drawings.

An embodiment of this application provides a signal processing device. The device includes an analog signal decomposition apparatus and a combination apparatus, where functions of the apparatuses in a signal processing process are:

The analog signal decomposition apparatus is configured to receive analog radio frequency signals of at least two frequency bands, to generate a first signal and a second signal, where the first signal and the second signal are obtained through a non-linear change based on an analog radio frequency signal of a first frequency band, and the first frequency band is any one of the at least two frequency bands.

The combination apparatus is configured to: combine the first signal obtained based on the analog radio frequency signal of the first frequency band and a first signal obtained based on an analog radio frequency signal of another frequency band, and combine the second signal obtained based on the analog radio frequency signal of the first frequency band and a second signal obtained based on the analog radio frequency signal of the another frequency band, to generate two paths of signals, where the another frequency band is a frequency band other than the first frequency band in the at least two frequency bands, and spectra of the two paths of signals include the at least two frequency bands.

The first signal and the second signal that are obtained based on the analog radio frequency signal of any frequency band are obtained after over-distortion is performed based on the analog radio frequency signal of the frequency band. Therefore, the first signal and the second signal are mainly distributed on the frequency band, and in addition, a small quantity of signals are distributed on two sides of the frequency band.

In the foregoing process, the analog signal decomposition apparatus may perform non-linear change processing based on the analog radio frequency signal of each of the at least two frequency bands, to obtain the first signal and the second signal. Because the first signal and the second signal have nonlinearity, the two paths of signals obtained by the combination apparatus by combining first signals obtained based on the analog radio frequency signals of the at least two frequency bands, and by combining second signals obtained based on the analog radio frequency signals of the at least two frequency bands also have nonlinearity. Therefore, after the two paths of signals are input into a dual-input power amplifier, the dual-input power amplifier can achieve optimal working performance.

Spectra of the two paths of signals obtained by the combination apparatus both include the at least two frequency bands. In other words, the two paths of signals are multi-band signals, and satisfy non-linear requirements of a power amplifier for multi-band signals.

Optionally, in this embodiment of this application, one analog signal decomposition apparatus may perform non-linear change processing on analog radio frequency signals in a plurality of frequency bands, or perform non-linear change processing only on an analog radio frequency signal in one frequency band. Therefore, one analog signal decomposition apparatus or at least two analog signal decomposition apparatuses, or analog signal decomposition apparatuses whose quantity is less than a quantity of the at least two frequency bands may exist in the signal processing device. This is not limited in this embodiment of this application.

Similarly, optionally, in this embodiment of this application, the signal processing device may combine obtained first signals, and combine obtained second signals by using one combination apparatus, or the signal processing device respectively combines the obtained first signals and the second signals by using two combination apparatuses.

Figure 2:
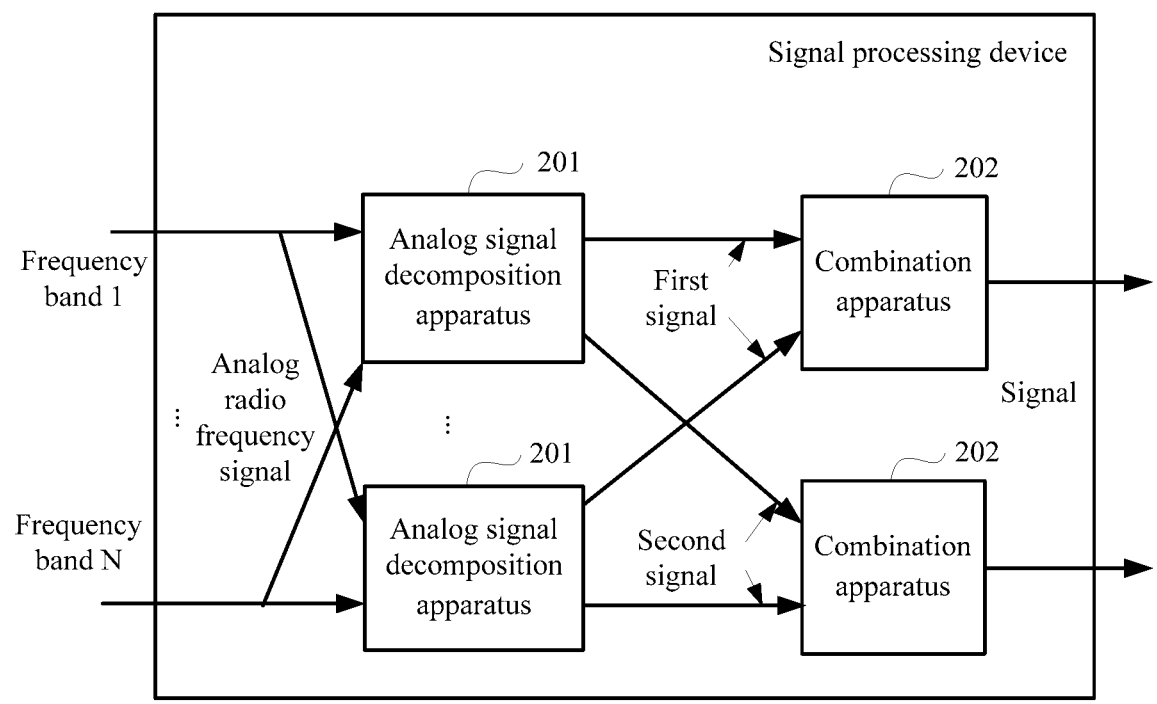
FIG. 2 is a structural diagram of another signal processing device according to an embodiment of this application.

Based on the foregoing descriptions, an embodiment of this application provides schematic structural diagrams of two possible signal processing devices, as shown in FIG. 1 and FIG. 2. N shown in the figures is a positive integer greater than or equal to 2.

An analog signal decomposition apparatus 101 and a combination apparatus 102 exist in the signal processing device shown in FIG. 1. The analog signal decomposition apparatus 101 implements non-linear change processing on an analog radio frequency signal in each of at least two frequency bands (for example, a frequency band 1 to a frequency band N), and the combination apparatus 102 combines obtained first signals, and combines obtained second signals.

N analog signal decomposition apparatuses 201 and two combination apparatuses 202 exist in the signal processing device shown in FIG. 2. Each analog signal decomposition apparatus 201 performs non-linear change processing on an analog radio frequency signal in one of N frequency bands, and one of the two combination apparatuses 202 combines obtained first signals, and the other one of the two combination apparatuses 202 combines obtained second signals.

It should be noted that the two signal processing devices in FIG. 1 and FIG. 2 are merely two examples of a structure of the signal processing device provided in this embodiment of the present invention. The signal processing device provided in this embodiment of this application further has other structural forms, and is not limited to the two structural forms.

Optionally, when performing non-linear change processing on the analog radio frequency signal of each frequency band, the analog signal decomposition apparatus is specifically configured to:

obtain, through envelope detection and controllable non-linear processing, the first signal and the second signal that are generated based on the analog radio frequency signal of each frequency band.

By using the foregoing method, the analog signal decomposition apparatus can enable the generated first signal and second signal to have nonlinearity.

Because a conventional digital signal decomposition module has very high requirements for a sampling rate and a bandwidth of the signal processing device, the conventional digital signal decomposition module may fail to complete decomposition of multi-band signals or may cause excessively high device costs. A conventional analog signal decomposition module cannot generate expected amplitude and phase characteristics in various frequency bands simultaneously. Therefore, the conventional analog signal decomposition module cannot achieve a relatively good signal decomposition effect, either. Based on the foregoing descriptions, to achieve a relatively good signal decomposition effect, an embodiment of this application further provides analog signal decomposition apparatuses of two novel structures, as shown in FIG. 3 and FIG. 4.

Figure 3:
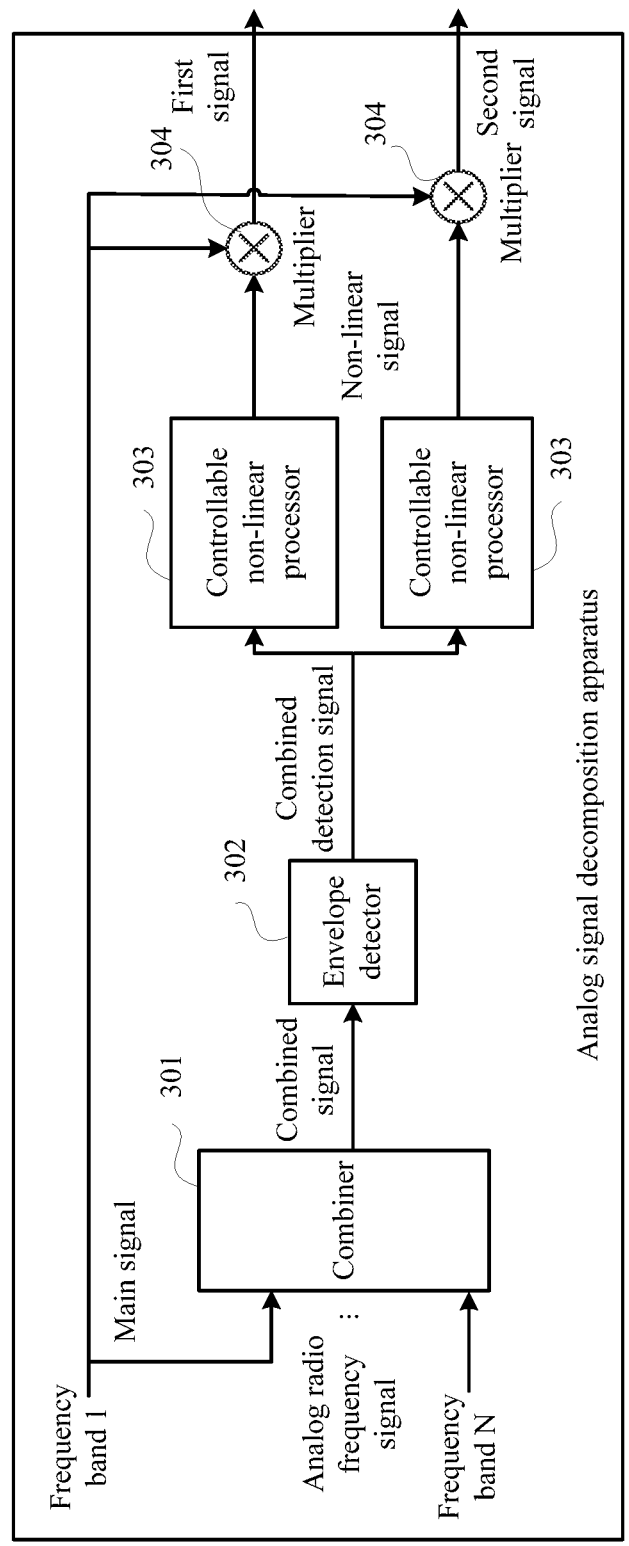
FIG. 3 is a structural diagram of an analog signal decomposition apparatus according to an embodiment of this application.
Figure 4:
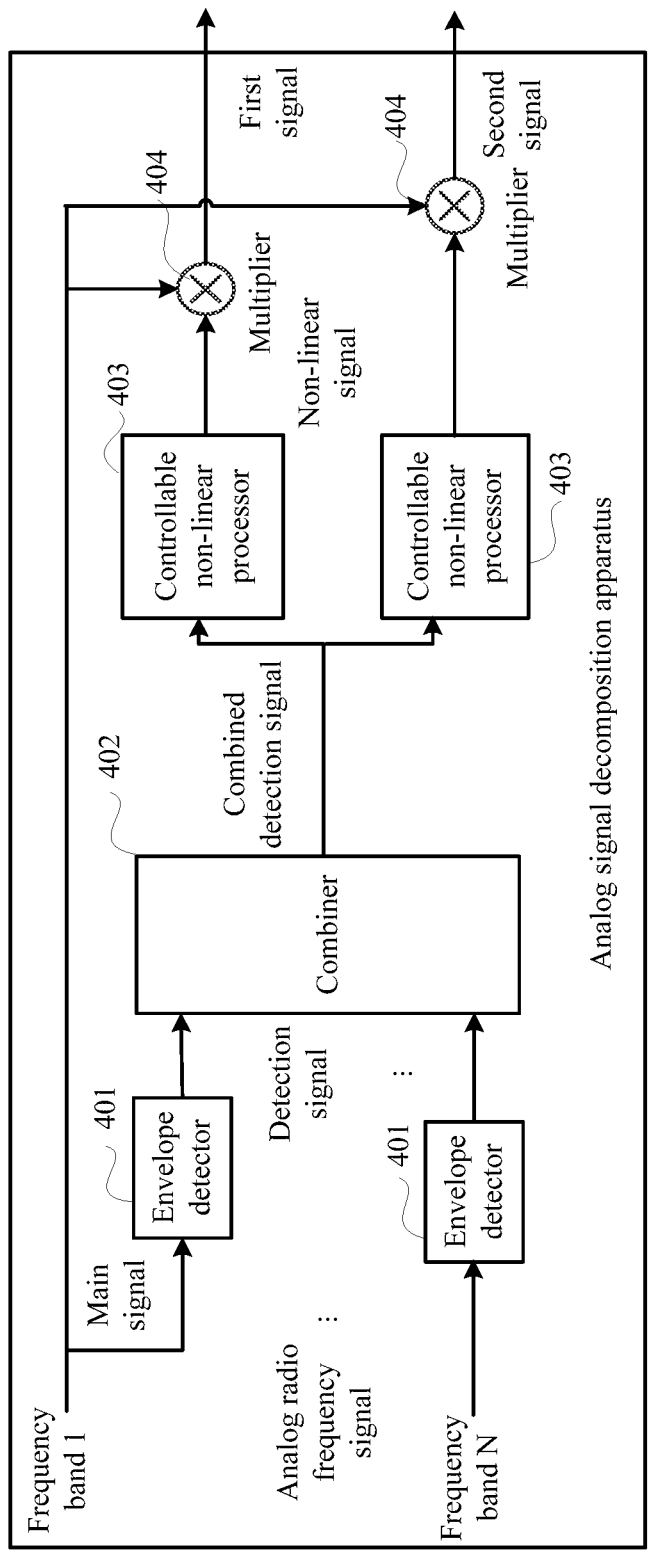
FIG. 4 is a structural diagram of another analog signal decomposition apparatus according to an embodiment of this application.

FIG. 3 shows a structure of an analog signal decomposition apparatus according to an embodiment of this application. As shown in the figure, the analog signal decomposition apparatus includes a combiner 301, an envelope detector 302, a controllable non-linear processor 303, and a multiplier 304.

When the analog signal decomposition apparatus makes a non-linear change on the analog radio frequency signal of the first frequency band (a frequency band 1 in the figure) to obtain the first signal and the second signal, functions of the modules are as follows:

The combiner 301 is configured to: receive the analog radio frequency signals of the at least two frequency bands, and combine the analog radio frequency signals of the at least two frequency bands, to generate a combined signal.

The envelope detector 302 is configured to perform envelope detection on the combined signal, to generate a combined detection signal.

The controllable non-linear processor 303 is configured to perform non-linear processing on the combined detection signal based on a non-linear parameter, to generate two paths of non-linear signals.

The multiplier 304 is configured to multiply each of the two paths of non-linear signals by the analog radio frequency signal of the first frequency band (that is, a main signal of the analog signal decomposition apparatus) to obtain the first signal and the second signal.

Optionally, the analog signal decomposition apparatus may generate two paths of non-linear signals by using one controllable non-linear processor 303 or the analog signal decomposition apparatus performs non-linear processing on two paths of combined detection signals by using two controllable non-linear processors 303, to generate two paths of non-linear signals. This is not limited in this application.

Similarly, optionally, the analog signal decomposition apparatus may multiply each of the two paths of non-linear signals by the analog radio frequency signal of the first frequency band by using one or two multipliers. This is not limited in this application. FIG. 3 is merely a possible structural example of the analog signal decomposition apparatus.

In a process in which the analog signal decomposition apparatus makes a non-linear change on the analog radio frequency signal of the first frequency band, to obtain the first signal and the second signal, the combiner 301 may combine the at least two analog radio frequency signals into one combined signal including a plurality of frequency bands; the envelope detector 302 may generate envelope information of the combined signal; and the controllable non-linear processor 303 may generate nonlinearity required by a dual-input power amplifier.

Therefore, the signal processing device can obtain the first signal and the second signal that have nonlinearity required by the dual-input power amplifier by using the analog signal decomposition apparatus shown in FIG. 3, to ensure that the two paths of signals obtained through subsequent combination also have the nonlinearity, so that after the two paths of signals are input into the dual-input power amplifier, the dual-input power amplifier can achieve optimal working performance.

Optionally, the controllable non-linear processor 303 uses different non-linear parameters to perform non-linear processing on the combined detection signal, to generate two paths of non-linear signals. To be specific, the two paths of non-linear signals are separately generated by the controllable non-linear processor 303 based on different non-linear parameters.

Optionally, the different non-linear parameters all satisfy the non-linear working characteristic of the dual-input power amplifier. To be specific, the controllable non-linear processor 303 may determine the different non-linear parameters based on the non-linear working characteristic of the dual-input power amplifier. For example, traverse scanning may be performed on the dual-input power amplifier, so as to obtain the different non-linear parameters.

By setting the non-linear parameter of the controllable non-linear processor 303, it can be ensured that the generated two paths of non-linear signals include, in each frequency band, the non-linear feature that satisfies a power amplifier characteristic requirement of the dual-input power amplifier. In this way, after the two paths of non-linear signals enter the dual-input power amplifier after various types of processing, accurate load pulling is formed, to ensure that the dual-input power amplifier can achieve optimal working efficiency and optimal linearity, or implement a compromise among optimal working efficiency and optimal linearity.

Further, when the signal processing device includes a plurality of analog signal decomposition apparatuses, all analog signal decomposition apparatuses that use the structure shown in FIG. 3 and that are in the plurality of analog signal decomposition apparatuses need to determine a non-linear parameter of the controllable non-linear processor 303 therein based on a non-linear working characteristic of the dual-input power amplifier.

FIG. 4 shows a structure of another analog signal decomposition apparatus according to an embodiment of this application. As shown in the figure, the analog signal decomposition apparatus includes an envelope detector 401, a combiner 402, a controllable non-linear processor 403, and a multiplier 404.

When the analog signal decomposition apparatus makes a non-linear change on the analog radio frequency signal of the first frequency band (a frequency band 1 in the figure) to obtain the first signal and the second signal, functions of the modules are as follows:

The envelope detector 401 is configured to: receive the analog radio frequency signals of the at least two frequency bands, and perform envelope detection on the analog radio frequency signals of the at least two frequency bands, to generate at least two paths of detection signals.

The combiner 402 is configured to combine the at least two paths of detection signals, to generate a combined detection signal.

The controllable non-linear processor 403 is configured to perform non-linear processing on the combined detection signal based on different non-linear parameters, to generate two paths of non-linear signals.

The multiplier 404 is configured to multiply each of the two paths of non-linear signals by the analog radio frequency signal of the first frequency band (that is, a main signal of the analog signal decomposition apparatus) to obtain the first signal and the second signal.

Optionally, the analog signal decomposition apparatus may generate the at least two paths of detection signals by using one envelope detector 401, or separately generate each of the at least two paths of detection signals by using the at least two envelope detectors 401, as shown in FIG. 4.

Optionally, the analog signal decomposition apparatus may generate two paths of non-linear signals by using one controllable non-linear processor 403 or the analog signal decomposition apparatus performs non-linear processing on two paths of combined detection signals by using two controllable non-linear processors 403, to generate two paths of non-linear signals. This is not limited in this application.

Similarly, optionally, the analog signal decomposition apparatus may multiply each of the two paths of non-linear signals by the analog radio frequency signal of the first frequency band by using one or two multipliers. This is not limited in this application. FIG. 4 is merely a possible structural example of the analog signal decomposition apparatus.

In a process in which the analog signal decomposition apparatus makes a non-linear change on the analog radio frequency signal of the first frequency band, to obtain the first signal and the second signal, the envelope detector 401 may generate envelope information of the at least two analog radio frequency signals; the combiner 402 may combine the at least two paths of detection signals into one combined detection signal including a plurality of frequency bands; and the controllable non-linear processor 403 may generate nonlinearity required by a dual-input power amplifier.

Therefore, the signal processing device can obtain the first signal and the second signal that have nonlinearity required by the dual-input power amplifier by using the analog signal decomposition apparatus shown in FIG. 4, to ensure that the two paths of signals obtained through subsequent combination also have non-linear features, so that after the two paths of signals are input into the dual-input power amplifier, the dual-input power amplifier can achieve optimal working performance.

The same as the analog signal decomposition apparatus shown in FIG. 3, two controllable non-linear processors 403 in the analog signal decomposition apparatus shown in FIG. 4 also use different non-linear parameters to perform non-linear processing on the combined detection signal, to generate two paths of non-linear signals. Because used principles are the same, reference may be made to the foregoing descriptions, and details are not described herein again.

By setting the non-linear parameter of the controllable non-linear processor 403, it can be ensured that the generated two paths of non-linear signals include, in each frequency band, the nonlinearity that satisfies a power amplifier characteristic requirement of the dual-input power amplifier. In this way, after the two paths of non-linear signals enter the dual-input power amplifier after various types of processing, accurate load pulling is formed, to ensure that the dual-input power amplifier can achieve optimal working efficiency and optimal linearity, or implement a compromise among optimal working efficiency and optimal linearity.

Further, when the signal processing device includes a plurality of analog signal decomposition apparatuses, all analog signal decomposition apparatuses that use the structure shown in FIG. 4 and that are in the plurality of analog signal decomposition apparatuses need to determine a non-linear parameter of the controllable non-linear processor 403 therein based on a non-linear working characteristic of the dual-input power amplifier.

By comparing FIG. 3 with FIG. 4, it can be learned that a difference between the two structures lies in that sequences of implementing combination and envelope detection are different. To be specific, relative positions of the combiner and the envelope detector are different. Therefore, advantages of the two structures are different. The analog signal decomposition apparatus shown in FIG. 3 may implement more accurate nonlinearity, so that working efficiency of the dual-input power amplifier is improved; and a detection signal output by the envelope detector in the analog signal decomposition apparatus shown in FIG. 4 is a narrowband signal, and has a low bandwidth requirement for an input matching circuit of the dual-input power amplifier.

In this embodiment of this application, the structure of the analog signal decomposition apparatus in the signal processing device is not limited. Therefore, when the signal processing device includes a plurality of analog signal decomposition apparatuses, the plurality of analog signal decomposition apparatuses may all use the structure shown in FIG. 3, or the plurality of analog signal decomposition apparatuses may all use the structure shown in FIG. 4, or some of the plurality of analog signal decomposition apparatuses use the structure shown in FIG. 3, and other use the structure shown in FIG. 4, or the plurality of analog signal decomposition apparatuses may use another structure having a same function as that of the analog signal decomposition apparatus shown in FIG. 3 or FIG. 4.

In this embodiment of this application, when the plurality of analog signal decomposition apparatuses in the signal processing device use a same structure (that is, the structure shown in FIG. 3 or the structure shown in FIG. 4), because signals input and output by the combiner in each analog signal decomposition apparatus are the same and signals input and output by the envelope detector are also the same, the plurality of analog signal decomposition apparatuses may share the part of circuit of the combiner and the envelope detector. In this way, a quantity of circuit devices in the signal processing device can be reduced, and circuit layout expenses can be reduced.

Figure 5:
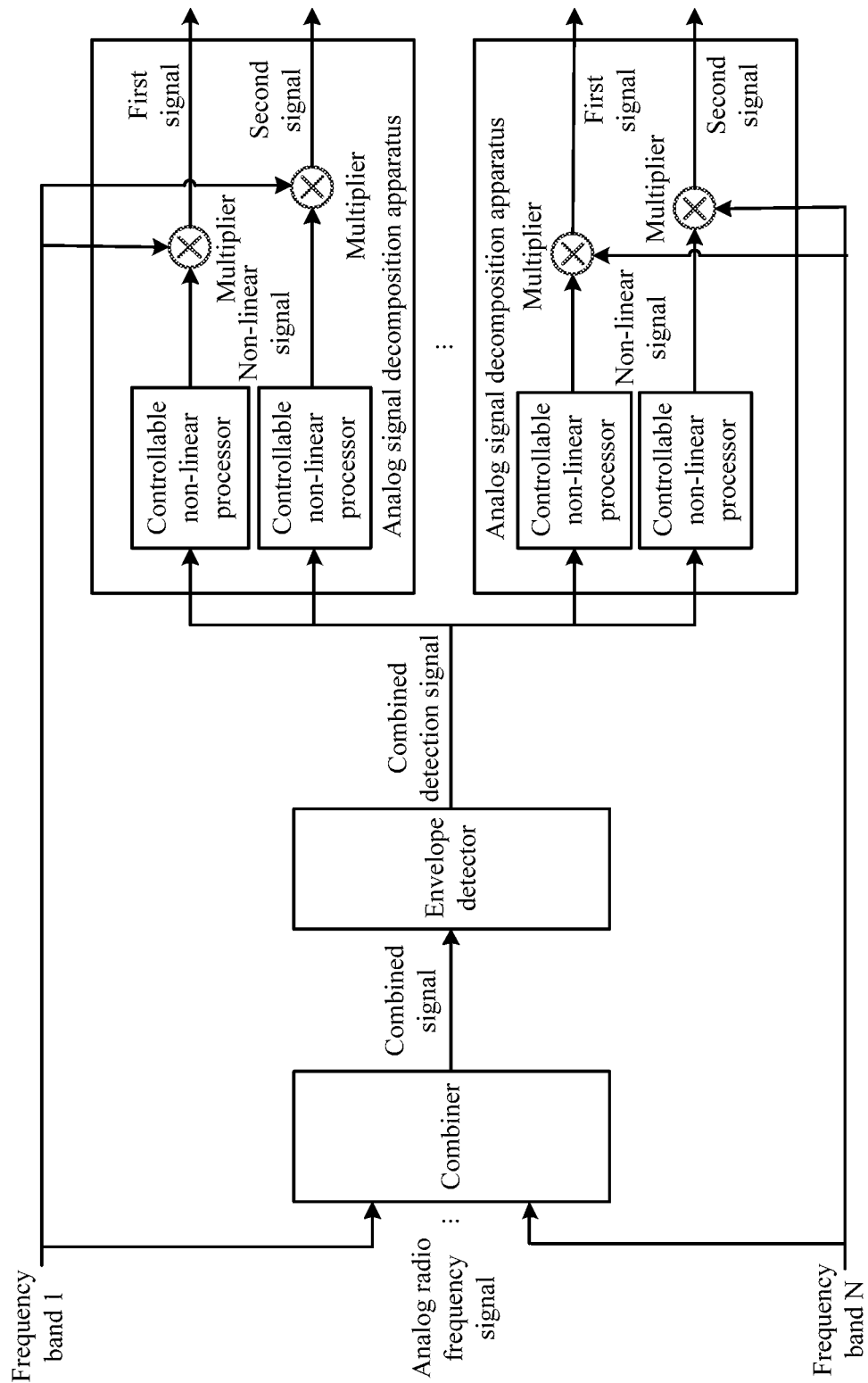
FIG. 5 is a structural diagram of a plurality of analog signal decomposition apparatuses according to an embodiment of this application.

For example, when the plurality of analog signal decomposition apparatuses all use the structure shown in FIG. 3, a schematic structural diagram of the plurality of analog signal decomposition apparatuses is shown in FIG. 5.

In a process in which the plurality of analog signal decomposition apparatuses perform non-linear processing on radio frequency signals of a plurality of frequency bands, a combiner combines analog radio frequency signals of the plurality of frequency bands, to generate a combined signal; an envelope detector performs envelope detection on the combined signal, to generate a combined detection signal; a controllable non-linear processor in each analog signal decomposition apparatus separately obtains the combined detection signal for non-linear processing, to generate two paths of non-linear signals; and each analog signal decomposition apparatus multiplies separately generated two paths of non-linear signals by respective main signals by using a multiplier, to obtain the first signal and the second signal.

Figure 6:
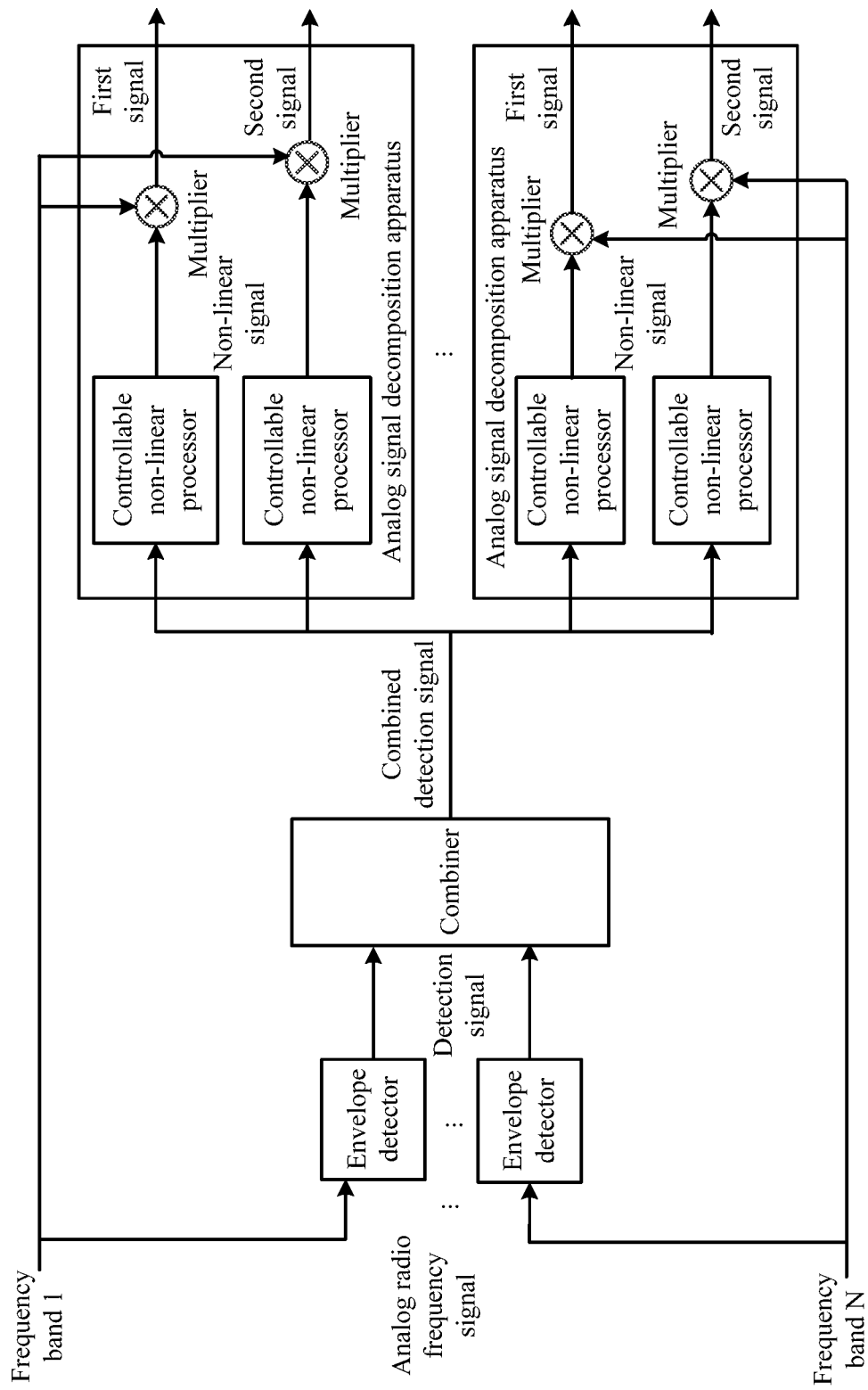
FIG. 6 is another structural diagram of a plurality of analog signal decomposition apparatuses according to an embodiment of this application.

For another example, when the plurality of analog signal decomposition apparatuses all use the structure shown in FIG. 4, a schematic structural diagram of the plurality of analog signal decomposition apparatuses is shown in FIG. 6.

In a process in which the plurality of analog signal decomposition apparatuses perform non-linear processing on radio frequency signals of a plurality of frequency bands, a plurality of envelope detectors perform envelope detection on radio frequency signals of the plurality of frequency bands, to generate a plurality of paths of detection signals; a combiner combines the plurality of paths of detection signals, to generate a combined detection signal; a controllable non-linear processor in each analog signal decomposition apparatus separately obtains the combined detection signal for non-linear processing, to generate two paths of non-linear signals; and each analog signal decomposition apparatus multiplies separately generated two paths of non-linear signals by respective main signals by using a multiplier, to obtain the first signal and the second signal.

In this embodiment of this application, the signal processing device, or the analog signal decomposition apparatus or the combination apparatus in the signal processing device may be set up by using discrete devices, or may be internally implemented by using a chip. This is not limited in this embodiment of this application.

In the foregoing embodiment, the signal processing device processes analog radio frequency signals of the at least two frequency bands. Therefore, when original signals received by the signal processing device are not the analog radio frequency signals of the at least two frequency bands, the signal processing device further needs to process the original signals, to obtain the analog radio frequency signals of the at least two frequency bands.

Optionally, when the original signals received by the signal processing device are analog baseband signals of at least two frequency bands, the signal processing device further includes a frequency conversion apparatus.

The frequency conversion apparatus is configured to: receive analog baseband signals of the at least two frequency bands, and perform frequency conversion on the analog baseband signals of the at least two frequency bands, to generate the analog radio frequency signals of the at least two frequency bands.

Optionally, the signal processing device may implement frequency conversion on the analog baseband signals of the at least two frequency bands by using one frequency conversion apparatus, or implement frequency conversion on the analog baseband signals of the at least two frequency bands by using frequency conversion apparatuses whose quantity is the same as that of the frequency bands. This is not limited in this application.

Optionally, based on the foregoing structure of the signal processing device, when the original signals received by the signal processing device are digital baseband signals of at least two frequency bands, the signal processing device further includes a digital-to-analog conversion apparatus.

The digital-to-analog conversion apparatus is configured to: receive digital baseband signals of the at least two frequency bands, and convert the digital baseband signals of the at least two frequency bands into the analog baseband signals of the at least two frequency bands. In this way, the frequency conversion apparatus can process the analog baseband signals of the at least two frequency bands, to obtain the analog radio frequency signals of the at least two frequency bands.

Optionally, the digital-to-analog conversion apparatus may be a digital analog converter (DAC).

This embodiment of this application provides a signal processing device, including the analog signal decomposition apparatus and the combination apparatus. The analog signal decomposition apparatus may make a non-linear change on an analog radio frequency signal of each of at least two frequency bands, to generate a first signal and a second signal obtained based on the analog radio frequency signal of each frequency band. The combination apparatus may combine first signals obtained based on the analog radio frequency signals of the at least two frequency bands, and combine second signals obtained based on the analog radio frequency signals of the at least two frequency bands, to finally generate two paths of signals whose spectra include the at least two frequency bands. Because the analog signal decomposition apparatus generates the first signal and the second signal by making the non-linear change on the analog radio frequency signal of each frequency band, the two paths of signals obtained by separately combining the generated first signals and second signals satisfy, in each frequency band, a non-linear feature of the dual-input power amplifier. Therefore, after the two paths of the signals are input into the dual-input power amplifier, the dual-input power amplifier can achieve optimal working performance. In addition, because the spectra of the generated two paths of signals include the at least two frequency bands, the two paths of signals are multi-band signals. In summary, the signal processing device can obtain multi-band signals that enable the dual-input power amplifier to achieve high working performance.

Figure 7:
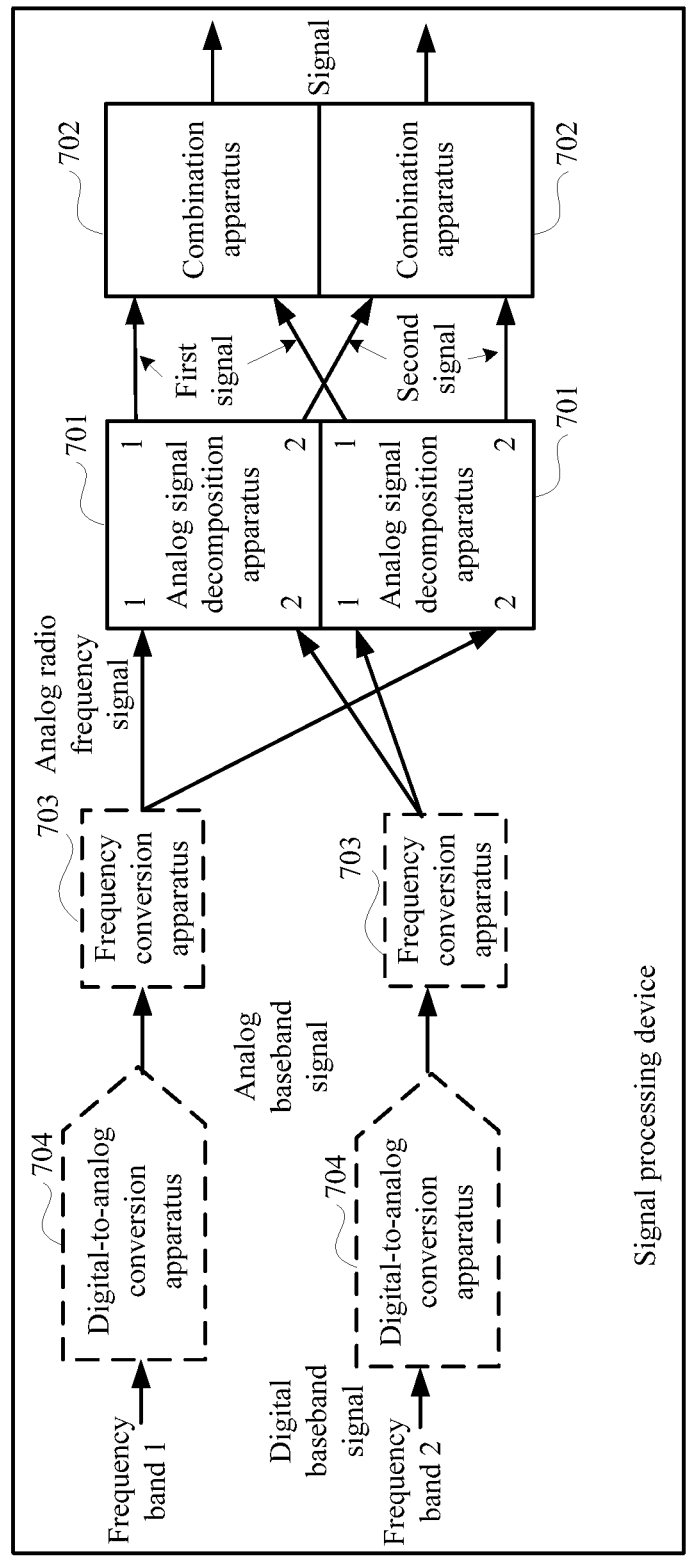
FIG. 7 is a structural example diagram of a signal processing device according to an embodiment of this application.

Based on the foregoing embodiment, an embodiment of this application further provides a signal processing device that processes analog radio frequency signals of two frequency bands. As shown in FIG. 7, the signal processing device includes two analog signal decomposition apparatuses 701 and two combination apparatuses 702.

In a signal processing process, each analog signal decomposition apparatus 701 receives analog radio frequency signals of a frequency band 1 and a frequency band 2, and separately performs non-linear change processing based on the analog radio frequency signal of one of the frequency bands, to obtain a first signal and a second signal that are obtained based on the analog signal of the frequency band.

One of the two combination apparatuses 702 combines first signals generated by the two analog signal decomposition apparatuses 701, to generate a path of signal, and the other combination apparatus 702 also combines first signals generated by the two analog signal decomposition apparatuses 701, to generate a path of signal, so that the signal processing device can obtain two paths of multi-band signals whose spectra include the frequency band 1 and the frequency band 2.

Optionally, when the original signals obtained by the signal processing device are analog baseband signals of the frequency band 1 and the frequency band 2, the signal processing device further includes two frequency conversion apparatuses 703. As shown in the figure, each frequency conversion apparatus 703 is configured to separately perform frequency conversion on an analog baseband signal of a frequency band, to obtain an analog radio frequency signal of the corresponding frequency band.

Optionally, when the original signals obtained by the signal processing device are digital baseband signals of the frequency band 1 and the frequency band 2, the signal processing device not only includes the foregoing two frequency conversion apparatuses 703 but also includes two digital-to-analog conversion apparatuses 704. As shown in the figure, each digital-to-analog conversion apparatus 704 is configured to separately perform digital-to-analog conversion processing on a digital baseband signal of a frequency band, to obtain an analog baseband signal of the frequency band, so as to obtain an analog radio frequency signal of the corresponding frequency band by using the frequency conversion apparatus.

Figure 8:
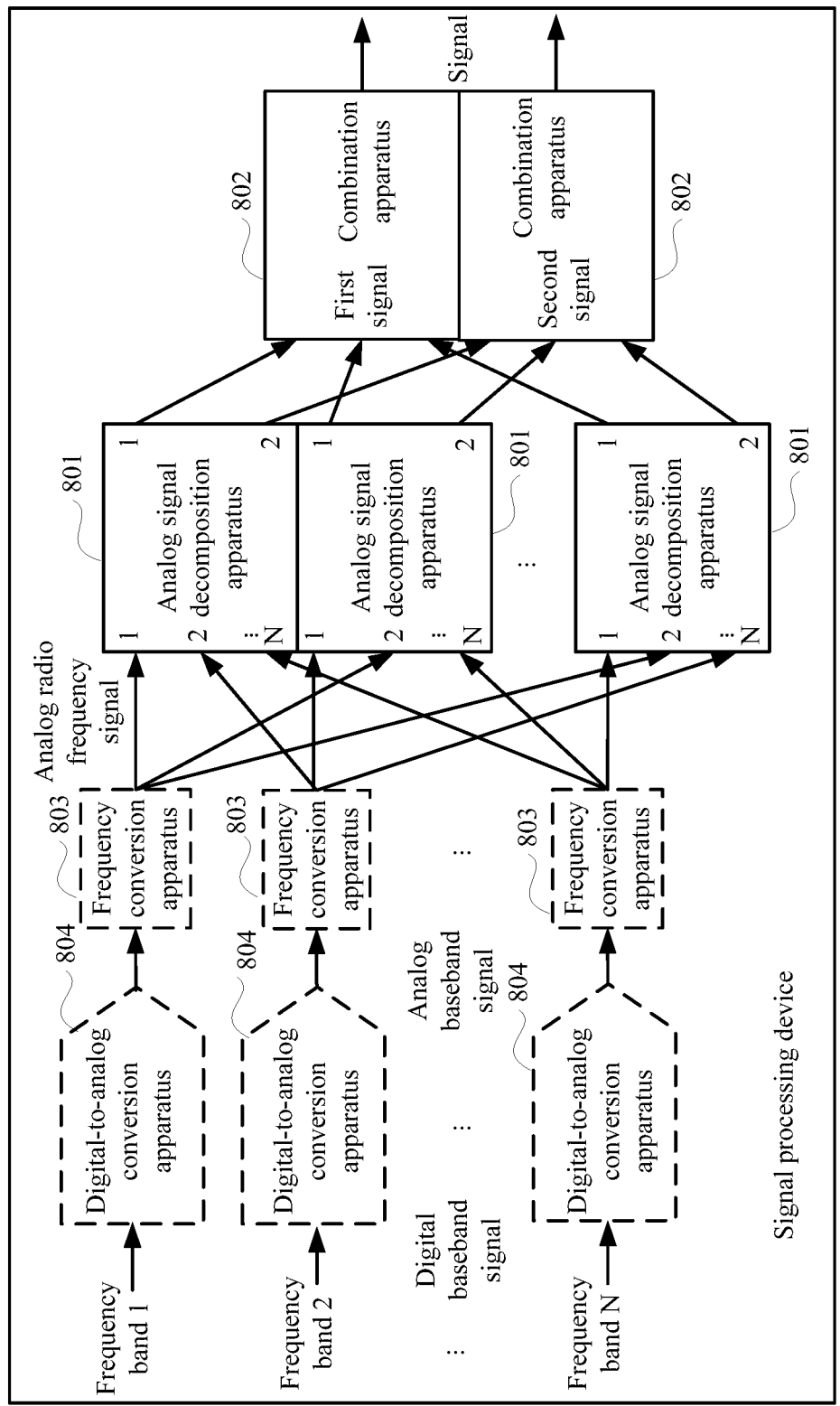
FIG. 8 is a structural example diagram of another signal processing device according to an embodiment of this application.
Figure 9:
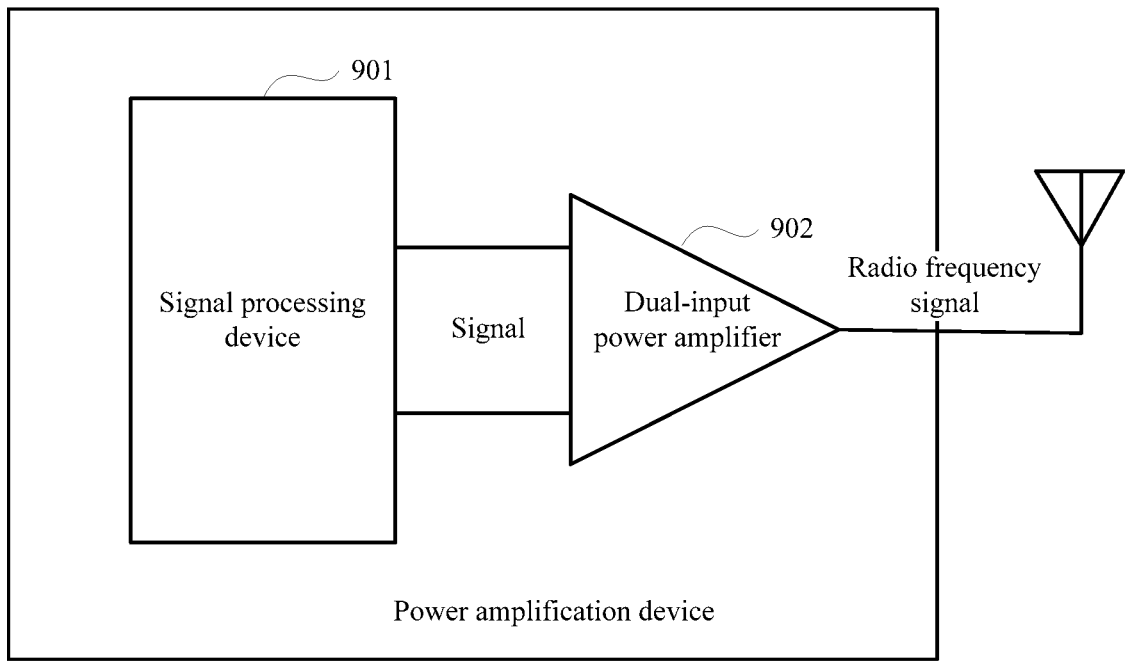
FIG. 9 is a structural diagram of a power amplification device according to an embodiment of this application.

Based on the foregoing embodiment, an embodiment of this application further provides a signal processing device that processes analog radio frequency signals of N frequency bands. As shown in FIG. 8, the signal processing device includes N analog signal decomposition apparatuses 801 and two combination apparatuses 802, where N is a positive integer greater than 2. Optionally, the signal processing device further includes N frequency conversion apparatuses 803 and N digital-to-analog conversion apparatuses 804. In a signal processing process, for functions of the apparatuses, refer to the embodiment shown in FIG. 7, and details are not described herein again.

Based on the foregoing signal processing device, an embodiment of this application further provides a power amplification device. The power amplification device includes a signal processing device 901 and a dual-input power amplifier 902 in the foregoing embodiment. The dual-input power amplifier 902 is connected to the signal processing device 901. For apparatuses included in the signal processing device 901 and functions of the apparatuses, refer to the foregoing embodiment. Details are not described herein again.

After the power amplification device performs signal processing on the analog radio frequency signals of the at least two frequency bands by using the signal processing device 901, to obtain two paths of signals (multi-band signals), the dual-input power amplifier 902 is configured to perform power amplification on the two paths of signals to generate a path of radio frequency signal, where a spectrum of the radio frequency signal includes the at least two frequency bands.

Because the two paths of signals obtained by using the signal processing device satisfy nonlinearity of the power amplifier, by using the power amplification device provided in this embodiment of this application, the dual-input power amplifier in the power amplification device can achieve optimal working performance, and radio frequency signals that satisfy a non-linear requirement of a plurality of frequency bands are obtained.

Figure 10:
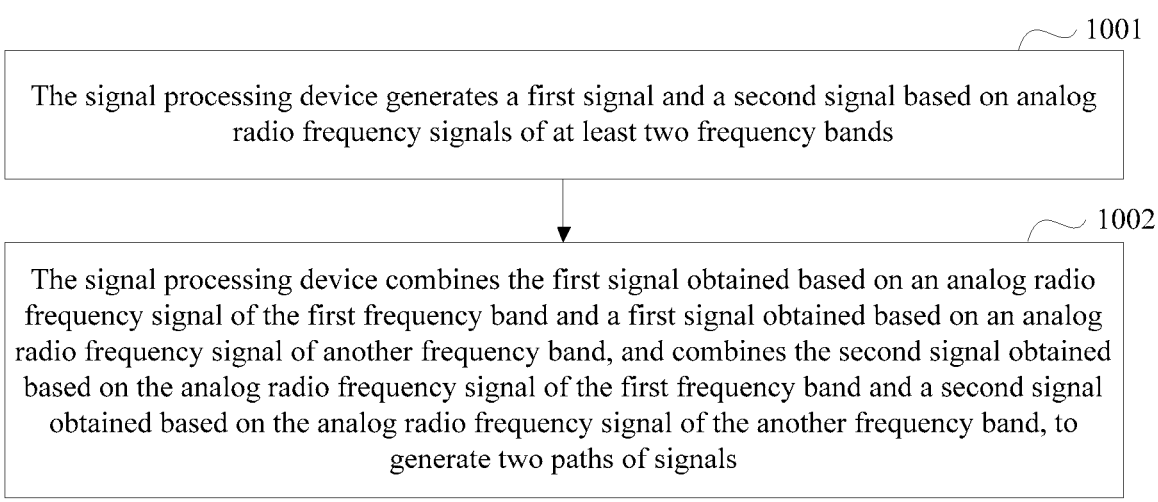
FIG. 10 is a flowchart of a signal processing method according to an embodiment of this application.

Based on the foregoing embodiment, an embodiment of this application further provides a signal processing method. The method is applicable to the signal processing device provided in the foregoing embodiment, or another device that needs to process multi-band signals. Referring to FIG. 10, a specific process of the method includes the following steps:

Step 1001: The signal processing device generates a first signal and a second signal based on analog radio frequency signals of at least two frequency bands, where the first signal and the second signal are obtained through a non-linear change based on an analog radio frequency signal of a first frequency band, and the first frequency band is any one of the at least two frequency bands.

Step 1002: The signal processing device combines the first signal obtained based on the analog radio frequency signal of the first frequency band and a first signal obtained based on an analog radio frequency signal of another frequency band, and combines the second signal obtained based on the analog radio frequency signal of the first frequency band and a second signal obtained based on the analog radio frequency signal of the another frequency band, to generate two paths of signals, where the another frequency band is a frequency band other than the first frequency band in the at least two frequency bands, and spectra of the two paths of signals include the at least two frequency bands.

Optionally, that the signal processing device generates a first signal and a second signal based on analog radio frequency signals of at least two frequency bands includes:
obtaining, by the signal processing device through envelope detection and controllable non-linear processing, the first signal and the second signal that are generated based on the analog radio frequency signal of the first frequency band.

Optionally, that the signal processing device generates a first signal and a second signal based on the analog radio frequency signals of the at least two frequency bands includes:
combining, by the signal processing device, the analog radio frequency signals of the at least two frequency bands, to generate a combined signal;
performing, by the signal processing device, envelope detection on the combined signal, to generate a combined detection signal;
performing, by the signal processing device, non-linear processing on the combined detection signal based on a non-linear parameter, to generate two paths of non-linear signals; and
multiplying, by the signal processing device, each of the two paths of non-linear signals by the analog radio frequency signal of the first frequency band to obtain the first signal and the second signal.

Optionally, that the signal processing device generates a first signal and a second signal based on the analog radio frequency signals of the at least two frequency bands includes:
performing, by the signal processing device, envelope detection on the analog radio frequency signals of the at least two frequency bands, to generate at least two paths of detection signals;
combining, by the signal processing device, the at least two paths of detection signals, to generate a combined detection signal;
performing, by the signal processing device, non-linear processing on the combined detection signal based on different non-linear parameters, to generate two paths of non-linear signals; and
multiplying, by the signal processing device, each of the two paths of non-linear signals by the analog radio frequency signal of the first frequency band to obtain the first signal and the second signal.

Optionally, before the signal processing device generates a first signal and a second signal based on analog radio frequency signals of at least two frequency bands, the method further includes:
performing, by the signal processing device, frequency conversion on analog baseband signals of the at least two frequency bands, to generate the analog radio frequency signals of the at least two frequency bands.

Optionally, before the performing, by the signal processing device, frequency conversion on analog baseband signals of the at least two frequency bands, the method further includes:
converting, by the signal processing device, digital baseband signals of the at least two frequency bands into the analog baseband signals of the at least two frequency bands.

By using the signal processing method provided in this embodiment of this application, the signal processing device may make a non-linear change on an analog radio frequency signal of each of at least two frequency bands, to generate a first signal and a second signal obtained based on the analog radio frequency signal of each frequency band, and combine first signals obtained based on the analog radio frequency signals of the at least two frequency bands, and combine second signals obtained based on the analog radio frequency signals of the at least two frequency bands, to finally generate two paths of signals whose spectra include the at least two frequency bands. Because the signal processing device generates the first signal and the second signal by making the non-linear change on the analog radio frequency signal of each frequency band, the two paths of signals obtained by separately combining the generated first signals and second signals satisfy nonlinearity of the dual-input power amplifier. Therefore, after the two paths of the signals are input into the dual-input power amplifier, the dual-input power amplifier can achieve optimal working performance. In addition, because the spectra of the generated two paths of signals include the at least two frequency bands, the two paths of signals are multi-band signals. In summary, by using the method, the signal processing device can obtain multi-band signals that enable the dual-input power amplifier to achieve high working performance.

Figure 11:
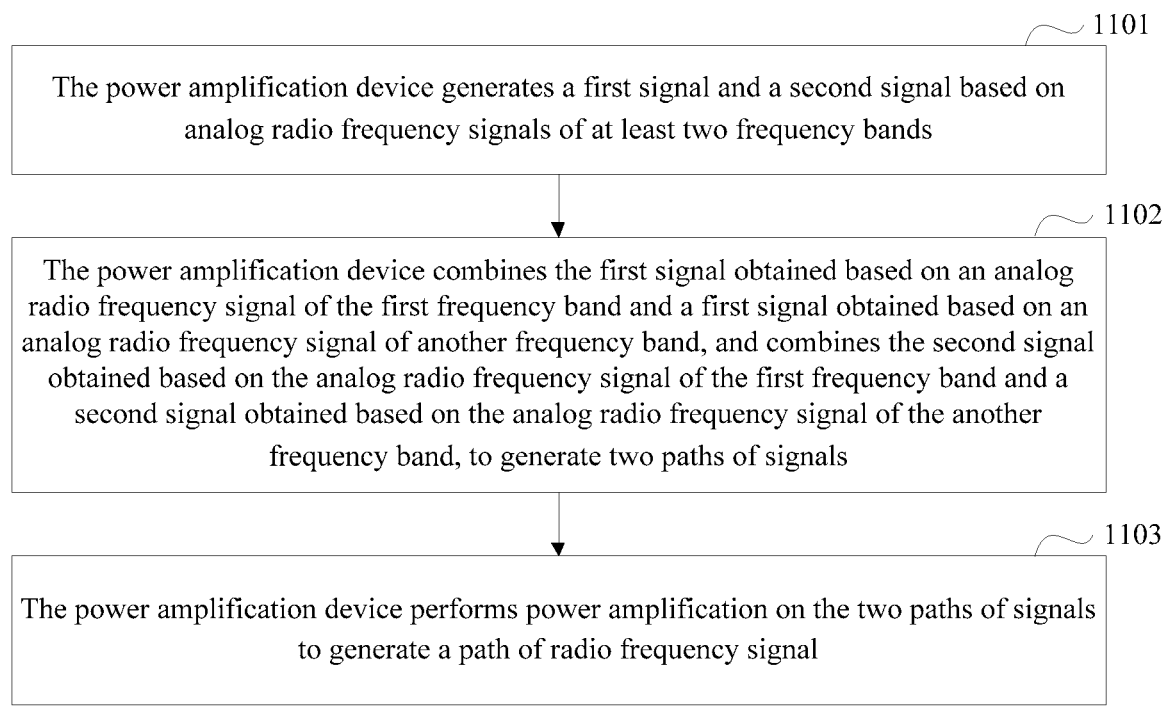
FIG. 11 is a flowchart of a power amplification device according to an embodiment of this application.

Based on the foregoing embodiment, an embodiment of this application further provides a power amplification method. The method is applicable to the power amplification device provided in the foregoing embodiment, or another device that needs to perform power amplification on multi-band signals. Referring to FIG. 11, a specific process of the method includes the following steps:

Step 1101: The power amplification device generates a first signal and a second signal based on analog radio frequency signals of at least two frequency bands, where the first signal and the second signal are obtained through a non-linear change based on an analog radio frequency signal of a first frequency band, and the first frequency band is any one of the at least two frequency bands.

Step 1102: The power amplification device combines the first signal obtained based on the analog radio frequency signal of the first frequency band and a first signal obtained based on an analog radio frequency signal of another frequency band, and combines the second signal obtained based on the analog radio frequency signal of the first frequency band and a second signal obtained based on the analog radio frequency signal of the another frequency band, to generate two paths of signals, where the another frequency band is a frequency band other than the first frequency band in the at least two frequency bands, and spectra of the two paths of signals include the at least two frequency bands.

Step 1103: The power amplification device performs power amplification on the two paths of signals to generate a path of radio frequency signal, where a spectrum of the radio frequency signal includes the at least two frequency bands.

The two paths of signals obtained by using the signal processing method in the foregoing embodiment satisfy nonlinearity of the power amplifier. Therefore, by using the power amplification method provided in this embodiment of this application, the dual-input power amplifier in the power amplification device can achieve optimal working performance, and radio frequency signals that satisfy non-linear requirements of multi-band signals are obtained.

The embodiments of this application provide a signal processing method and device. The signal processing device includes the analog signal decomposition apparatus and the combination apparatus. The analog signal decomposition apparatus may make a non-linear change on an analog radio frequency signal of each of at least two frequency bands, to generate a first signal and a second signal obtained based on the analog radio frequency signal of each frequency band. The combination apparatus may combine first signals obtained based on the analog radio frequency signals of the at least two frequency bands, and combine second signals obtained based on the analog radio frequency signals of the at least two frequency bands, to finally generate two paths of signals whose spectra include the at least two frequency bands. Because the analog signal decomposition apparatus generates the first signal and the second signal by making the non-linear change on the analog radio frequency signal of each frequency band, the two paths of signals obtained by separately combining the generated first signals and second signals satisfy, in each frequency band, a non-linear feature of the dual-input power amplifier. Therefore, after the two paths of the signals are input into the dual-input power amplifier, the dual-input power amplifier can achieve optimal working performance. In addition, because the spectra of the generated two paths of signals include the at least two frequency bands, the two paths of signals are broadband signals (or multi-band signals). In summary, the signal processing device can obtain multi-band signals that enable the dual-input power amplifier to achieve high working performance.

Obviously, a person skilled in the art can make various modifications and variations to the embodiments of this application without departing from the spirit and scope of the embodiments of the present invention. This application is intended to cover these modifications and variations provided that they fall within the scope of protection defined by the following claims and their equivalent technologies.

What is claimed is:

1. A signal processing device, comprising:
   an analog signal decomposition apparatus, configured to receive analog radio frequency signals of at least two frequency bands, to generate a first signal and a second signal, wherein the first signal and the second signal are generated through a non-linear change based on an analog radio frequency signal of a first frequency band, the first frequency band being any one of the at least two frequency bands; and
   a combination apparatus, configured to: combine the first signal obtained based on the analog radio frequency signal of the first frequency band and a first signal obtained based on an analog radio frequency signal of another frequency band, and combine the second signal obtained based on the analog radio frequency signal of the first frequency band and a second signal obtained based on the analog radio frequency signal of the another frequency band, to generate two paths of signals, wherein the another frequency band is a frequency band other than the first frequency band in the at least two frequency bands, and spectra of the two paths of signals comprise the at least two frequency bands.

2. The signal processing device according to claim 1, wherein the analog signal decomposition apparatus is specifically configured to obtain, through envelope detection and controllable non-linear processing, the first signal and the second signal that are generated based on the analog radio frequency signal of the first frequency band.

3. The signal processing device according to claim 1, wherein the analog signal decomposition apparatus comprises a combiner, an envelope detector, a controllable non-linear processor, and a multiplier;
   the combiner is configured to: receive the analog radio frequency signals of the at least two frequency bands, and combine the analog radio frequency signals of the at least two frequency bands, to generate a combined signal;
   the envelope detector is configured to perform envelope detection on the combined signal, to generate a combined detection signal;
   the controllable non-linear processor is configured to perform non-linear processing on the combined detection signal based on a non-linear parameter, to generate two paths of non-linear signals; and the multiplier is configured to multiply each of the two paths of non-linear signals by the analog radio frequency signal of the first frequency band to obtain the first signal and the second signal.

4. The signal processing device according to claim 1, wherein the analog signal decomposition apparatus comprises an envelope detector, a combiner, a controllable non-linear processor, and a multiplier;

the envelope detector is configured to: receive the analog radio frequency signals of the at least two frequency bands, and perform envelope detection on the analog radio frequency signals of the at least two frequency bands, to generate at least two paths of detection signals;

the combiner is configured to combine the at least two paths of detection signals, to generate a combined detection signal;

the controllable non-linear processor is configured to perform non-linear processing on the combined detection signal based on a non-linear parameter, to generate two paths of non-linear signals; and the multiplier is configured to multiply each of the two paths of non-linear signals by the analog radio frequency signal of the first frequency band to obtain the first signal and the second signal.

5. The signal processing device according to claim 1, further comprising a frequency conversion apparatus, configured to: receive analog baseband signals of the at least two frequency bands, and perform frequency conversion on the analog baseband signals of the at least two frequency bands, to generate the analog radio frequency signals of the at least two frequency bands.

6. The signal processing device according to claim 5, further comprising a digital-to-analog conversion apparatus, configured to: receive digital baseband signals of the at least two frequency bands, and convert the digital baseband signals of the at least two frequency bands into the analog baseband signals of the at least two frequency bands.

7. A power amplification device, comprising a signal processing device and a dual-input power amplifier, wherein the signal processing device comprises:

an analog signal decomposition apparatus, configured to receive analog radio frequency signals of at least two frequency bands, to generate a first signal and a second signal, wherein the first signal and the second signal are generated through a non-linear change based on an analog radio frequency signal of a first frequency band, the first frequency band being any one of the at least two frequency bands; and a combination apparatus, configured to: combine the first signal obtained based on the analog radio frequency signal of the first frequency band and a first signal obtained based on an analog radio frequency signal of another frequency band, and combine the second signal obtained based on the analog radio frequency signal of the first frequency band and a second signal obtained based on the analog radio frequency signal of the another frequency band, to generate two paths of signals, wherein the another frequency band is a frequency band other than the first frequency band in the at least two frequency bands, and spectra of the two paths of signals comprise the at least two frequency bands; and the dual-input power amplifier is connected to the combination apparatus and is configured to perform power amplification on the two paths of signals to generate a path of radio frequency signal, wherein a spectrum of the radio frequency signal comprises the at least two frequency bands.

8. A signal processing method, comprising:

generating a first signal and a second signal based on analog radio frequency signals of at least two frequency bands, wherein the first signal and the second signal are obtained through a non-linear change based on an analog radio frequency signal of a first frequency band, and the first frequency band is any one of the at least two frequency bands; and combining the first signal obtained based on the analog radio frequency signal of the first frequency band and a first signal obtained based on an analog radio frequency signal of another frequency band, and combining the second signal obtained based on the analog radio frequency signal of the first frequency band and a second signal obtained based on the analog radio frequency signal of the another frequency band, to generate two paths of signals, wherein the another frequency band is a frequency band other than the first frequency band in the at least two frequency bands, and spectra of the two paths of signals comprise the at least two frequency bands.

9. The method according to claim 8, wherein the generating a first signal and a second signal based on analog radio frequency signals of at least two frequency bands comprises:

obtaining, through envelope detection and controllable non-linear processing, the first signal and the second signal that are generated based on the analog radio frequency signal of the first frequency band.

10. The method according to claim 8, wherein the generating a first signal and a second signal based on analog radio frequency signals of at least two frequency bands comprises:

combining the analog radio frequency signals of the at least two frequency bands, to generate a combined signal;

performing envelope detection on the combined signal, to generate a combined detection signal;

performing non-linear processing on the combined detection signal based on a non-linear parameter, to generate two paths of non-linear signals; and multiplying each of the two paths of non-linear signals by the analog radio frequency signal of the first frequency band to obtain the first signal and the second signal.

11. The method according to claim 8, wherein the generating a first signal and a second signal based on analog radio frequency signals of at least two frequency bands comprises:

performing envelope detection on the analog radio frequency signals of the at least two frequency bands, to generate at least two paths of detection signals;

combining the at least two paths of detection signals, to generate a combined detection signal;

performing non-linear processing on the combined detection signal based on a non-linear parameter, to generate two paths of non-linear signals; and multiplying each of the two paths of non-linear signals by the analog radio frequency signal of the first frequency band to obtain the first signal and the second signal.

12. The method according to claim 8, wherein before the generating a first signal and a second signal based on analog radio frequency signals of at least two frequency bands, the method further comprises:

performing frequency conversion on analog baseband signals of the at least two frequency bands, to generate the analog radio frequency signals of the at least two frequency bands.

13. The method according to claim 12, wherein before the performing frequency conversion on analog baseband signals of the at least two frequency bands, the method further comprises:

converting digital baseband signals of the at least two frequency bands into the analog baseband signals of the at least two frequency bands.

14. The method according to claim 8, further comprising:

performing power amplification on the two paths of signals to generate a path of radio frequency signal, wherein a spectrum of the radio frequency signal comprises the at least two frequency bands.

* * * * *